US009219072B2

(12) United States Patent
Jeong et al.

(10) Patent No.: US 9,219,072 B2
(45) Date of Patent: *Dec. 22, 2015

(54) NONVOLATILE MEMORY DEVICES HAVING A THREE DIMENSIONAL STRUCTURE UTILIZING STRAPPING OF A COMMON SOURCE REGION AND/OR A WELL REGION

(71) Applicant: Samsung Electronics Co., Ltd, Suwon-si (KR)

(72) Inventors: Jaehun Jeong, Hwaseong-si (KR); Hansoo Kim, Suwon-si (KR); Jaehoon Jang, Seongnam-si (KR); Hoosung Cho, Yongin-si (KR); Kyoung-Hoon Kim, Yongin-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/548,557

(22) Filed: Nov. 20, 2014

(65) Prior Publication Data

US 2015/0076587 A1 Mar. 19, 2015

Related U.S. Application Data

(63) Continuation of application No. 13/478,482, filed on May 23, 2012, now Pat. No. 8,896,123, which is a continuation of application No. 12/798,525, filed on Apr. 6, 2010, now Pat. No. 8,203,211.

(30) Foreign Application Priority Data

Apr. 10, 2009 (KR) .................. 10-2009-0031368

(51) Int. Cl.
*H01L 27/115* (2006.01)
*H01L 23/522* (2006.01)

(52) U.S. Cl.
CPC ........ *H01L 27/11578* (2013.01); *H01L 27/115* (2013.01); *H01L 27/11517* (2013.01); *H01L 27/11565* (2013.01); *H01L 27/11582* (2013.01)

(58) Field of Classification Search
CPC .................. H01L 27/11578; H01L 27/11565; H01L 27/11517; H01L 27/115; H01L 27/11582; H01L 23/522; H01L 39/792; H01L 29/94
USPC ........... 257/773, 314, 315, 316, 324, 60, 626, 257/66, 774, E23.145, E27.03, E27.06, 257/E27.081, E29.309
See application file for complete search history.

(56) References Cited

U.S. PATENT DOCUMENTS 6,130,838 A 10/2000 Kim et al.
7,936,004 B2 * 5/2011 Kito et al. ..................... 257/324

(Continued)

FOREIGN PATENT DOCUMENTS

| CN | 101055875 | 10/2007 |
|---|---|---|
| CN | 101241914 | 8/2008 |

(Continued)

OTHER PUBLICATIONS

"Nonvolatile Memory Devices Having a Three Dimensional Structure" Specification, Drawings, Claims and Prosecution History, of U.S. Appl. No. 12/798,525, filed Apr. 6, 2010, by inventor(s), which is stored in the U.S. Patent and Trademark Office (USPTO).

(Continued)

*Primary Examiner* — Alexander Oscar Williams
(74) *Attorney, Agent, or Firm* — Onello & Mello LLP

(57) ABSTRACT

Provided is a nonvolatile memory device having a three dimensional structure. The nonvolatile memory device may include cell arrays having a plurality of conductive patterns having a line shape three dimensionally arranged on a semiconductor substrate, the cell arrays being separated from one another; semiconductor patterns extending from the semiconductor substrate to cross sidewalls of the conductive patterns; common source regions provided in the semiconductor substrate under a lower portion of the semiconductor patterns in a direction in which the conductive patterns extend; a first impurity region provided in the semiconductor substrate so that the first impurity region extends in a direction crossing the conductive patterns to electrically connect the common source regions; and a first contact hole exposing a portion of the first impurity region between the separated cell arrays.

8 Claims, 13 Drawing Sheets

(56) References Cited

U.S. PATENT DOCUMENTS

| | | |
|---|---|---|
| 7,956,408 B2 | 6/2011 | Enda et al. |
| 8,203,211 B2 * | 6/2012 | Jeong et al. .................. 257/773 |
| 8,335,109 B2 | 12/2012 | Seol et al. |
| 8,541,831 B2 | 9/2013 | Chae et al. |
| 8,551,838 B2 | 10/2013 | Kito et al. |
| 8,896,123 B2 * | 11/2014 | Jeong et al. .................. 257/773 |
| 2001/0023954 A1 | 9/2001 | Lee et al. |
| 2007/0252201 A1 | 11/2007 | Kito et al. |
| 2008/0173932 A1 | 7/2008 | Kidoh et al. |
| 2008/0179659 A1 | 7/2008 | Enda et al. |
| 2010/0013599 A1 | 1/2010 | Tartock et al. |
| 2010/0120214 A1 | 5/2010 | Park et al. |
| 2010/0133599 A1 * | 6/2010 | Chae et al. .................. 257/315 |
| 2010/0140685 A1 | 6/2010 | Kang et al. |
| 2010/0172182 A1 | 7/2010 | Seol et al. |
| 2010/0178755 A1 | 7/2010 | Lee et al. |
| 2010/0240205 A1 | 9/2010 | Son et al. |
| 2010/0258947 A1 | 10/2010 | Jeong et al. |
| 2010/0308398 A1 | 12/2010 | Shin et al. |
| 2011/0002178 A1 | 1/2011 | Hwang et al. |
| 2011/0143524 A1 | 6/2011 | Son et al. |
| 2011/0186851 A1 | 8/2011 | Son et al. |
| 2011/0240205 A1 * | 10/2011 | Kamei .................. 156/89.11 |
| 2011/0266607 A1 | 11/2011 | Sim et al. |
| 2011/0284947 A1 | 11/2011 | Kito et al. |
| 2011/0287597 A1 | 11/2011 | Kito et al. |
| 2012/0119287 A1 * | 5/2012 | Park et al. .................. 257/329 |
| 2012/0228712 A1 | 9/2012 | Jeong et al. |
| 2012/0299086 A1 | 11/2012 | Lee |
| 2014/0015128 A1 | 1/2014 | Chae et al. |
| 2014/0151774 A1 * | 6/2014 | Rhie .................. 257/314 |
| 2014/0241065 A1 * | 8/2014 | Shim et al. .................. 365/185.17 |

FOREIGN PATENT DOCUMENTS

| | | |
|---|---|---|
| JP | 2007266143 | 10/2007 |
| JP | 2007317874 | 12/2007 |
| JP | 2008171918 | 7/2008 |
| JP | 2008186868 | 8/2008 |
| KR | 2007096972 | 10/2007 |
| KR | 1020080070583 | 7/2008 |

OTHER PUBLICATIONS

Fukuzumi, Yoshiaki, et al., "Optimal Integration and Characteristics of Vertical Array Devices for Ultra-High Density, Bit-Cost Scalable Flash Memory", 2007 IEEE, pp. 449-452.

Tanaka, H. et al., "Bit Cost Scalable Technology with Punch and Plug Process for Ultra High Density Flash Memory", 2007 Symposium on VLSI Technology Digest of Technical Papers, pp. 14-15.

Examination Report dated Nov. 26, 2013 issued in corresponding Chinese Patent App. No. 201010163558.3.

"Nonvolatile Memory Devices Having a Three Dimensional Structure" Specification, Drawings, and Prosecution History, of U.S. Appl. No. 13/478,482, filed May 23, 2012, by Jaehun Jeong, et al., which is stored in the United States Patent and Trademark Office (USPTO).

* cited by examiner

NONVOLATILE MEMORY DEVICES HAVING A THREE DIMENSIONAL STRUCTURE UTILIZING STRAPPING OF A COMMON SOURCE REGION AND/OR A WELL REGION

CROSS-REFERENCE TO RELATED APPLICATIONS

This application is a continuation application of U.S. patent application Ser. No. 13/478,482, filed on May 23, 2012, now U.S. Pat. No. 8,896,123, which is a continuation application of U.S. patent application Ser. No. 12/798,525, filed on Apr. 6, 2010, now U.S. Pat. No. 8,203,211. This application claims priority under 35 U.S.C. §119 to Korean Patent Application No. 10-2009-0031368, filed on Apr. 10, 2009, the contents of which are herein incorporated by reference in their entirety.

BACKGROUND OF THE INVENTIVE CONCEPT

1. Field

The present inventive concept relates to nonvolatile memory devices, and more particularly, to nonvolatile memory devices having a three dimensional structure having high integration without increasing a size of a cell array.

2. Description of the Related Art

Generally, nonvolatile memory devices can electrically erase and program data, and can retain their stored data even when their power supplies are interrupted. For this reason, the nonvolatile memory devices are being widely used in various fields.

Nonvolatile memory devices include various types of memory cell transistors and are classified into a NAND-type and a NOR-type according to a cell array structure. A NAND-type nonvolatile memory device has an advantage of high integration and a NOR-type nonvolatile memory device has an advantage of high speed.

In particular, since the NAND-type nonvolatile memory device has a cell string structure serially connecting a plurality of memory cell transistors, it provides the advantage of high integration. Also, since the NAND-type nonvolatile memory device adopts an operation method of simultaneously changing data stored in a plurality of memory cell transistors, a speed of updating data is high compared with the NOR-type nonvolatile memory device. The NAND-type nonvolatile memory device is mainly used in a portable device which requires a mass storage device such as a digital camera or a MP3 player because of high integration and high speed of updating data.

Studies for promoting and improving the advantages of the NAND-type nonvolatile memory device have been performed and as a part of these studies, NAND-type nonvolatile memory devices having three dimensional structures have been developed.

SUMMARY OF THE INVENTIVE CONCEPT

Exemplary embodiments of the inventive concept provide a nonvolatile memory device having a three dimensional structure. According to one aspect of the present inventive concept, a nonvolatile memory device may include cell arrays having a plurality of conductive patterns having a line shape three dimensionally arranged on a semiconductor substrate, the cell arrays being separated from one another; semiconductor patterns extending from the semiconductor substrate to cross sidewalls of the conductive patterns; common source regions provided in the semiconductor substrate under a lower portion of the semiconductor patterns in a direction in which the conductive patterns extend; a first impurity region provided in the semiconductor substrate so that the first impurity region extends in a direction crossing the conductive patterns to electrically connect the common source regions; and a first contact hole exposing a portion of the first impurity region between the separated cell arrays.

In one exemplary embodiment, a distance between the separated cell arrays is greater than a distance between separated conductive patterns.

In one exemplary embodiment, the first impurity region has the same conductivity type as the common source regions.

In one exemplary embodiment, the nonvolatile memory device further includes a contact plug filling the first contact hole and a common source line provided in a direction in which the first impurity region extends or in a direction crossing the impurity region while being electrically connected to the contact plug.

In one exemplary embodiment, the nonvolatile memory device further includes a second impurity region which is separated from the first impurity region and provided between the separated cell arrays. The second impurity region has a different conductivity type from the first impurity region. In another exemplary embodiment, the nonvolatile memory device further includes a second contact hole exposing a portion of the second impurity region.

Embodiments of the inventive concept also provide another nonvolatile memory device having a three dimensional structure. According to another aspect of the inventive concept, a nonvolatile memory device may include cell arrays having conductive patterns of a flat shape that are sequentially stacked on a semiconductor substrate, the cell arrays being separated from one another; semiconductor patterns vertically extending from the semiconductor substrate to penetrate the conductive patterns; a common source region provided on an entire surface of the semiconductor substrate; and a first contact hole exposing a portion of the common source region between the separated cell arrays.

In one exemplary embodiment, each area of the conductive patterns decreases as the conductive patterns extend in a stacked direction from the semiconductor substrate.

In one exemplary embodiment, the nonvolatile memory device further includes a contact plug filling the first contact hole and a common source line provided in a direction in which the cell arrays extend or in a direction crossing the cell arrays while being electrically connected to the contact plug.

BRIEF DESCRIPTION OF THE DRAWINGS

The foregoing and other features and advantages of the inventive concept will be apparent from the more particular description of preferred aspects of the inventive concept, as illustrated in the accompanying drawings in which like reference characters refer to the same parts throughout the different views. The drawings are not necessarily to scale, emphasis instead being placed upon illustrating the principles of the inventive concept. In the drawings, the thickness of layers and regions are exaggerated for clarity.

DETAILED DESCRIPTION OF THE EMBODIMENTS

Figure 1:
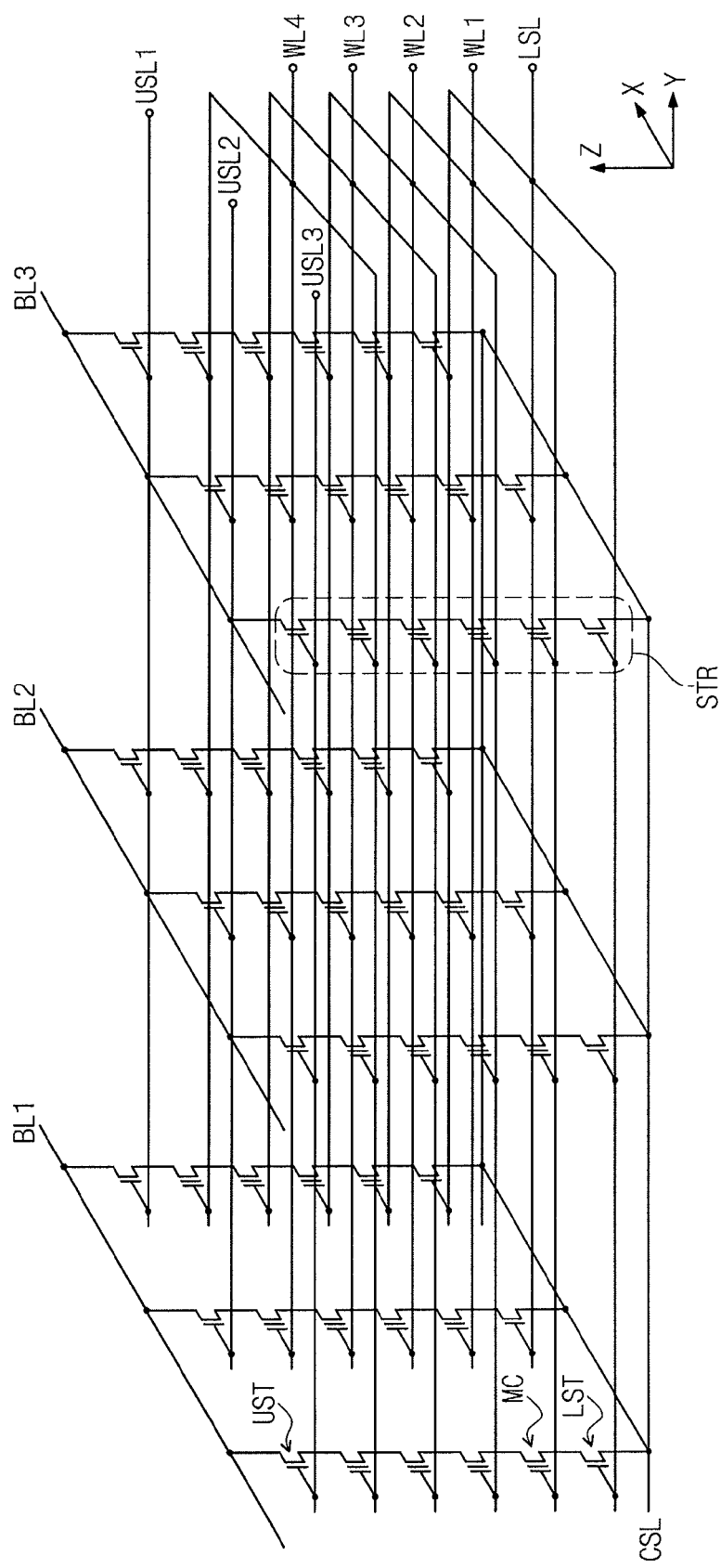
FIG. 1 is a circuit diagram of a nonvolatile memory device, in accordance with exemplary embodiments of the present inventive concept.

Preferred embodiments of the inventive concept will be described below in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

In the drawings, the thickness of layers and regions are exaggerated for clarity. It will also be understood that when an element such as a layer, region or substrate is referred to as being "on" or "onto" another element, it may lie directly on the other element or intervening elements or layers may also be present.

Embodiments of the inventive concept may be described with reference to cross-sectional illustrations, which are schematic illustrations of idealized embodiments of the present inventive concept. As such, variations from the shapes of the illustrations, as a result, for example, of manufacturing techniques and/or tolerances, are to be expected. Thus, embodiments of the present inventive concept should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present inventive concept.

FIG. 1 is a circuit diagram of a nonvolatile memory device, in accordance with exemplary embodiments of the present inventive concept.

Referring to FIG. 1, a nonvolatile memory device, in accordance with an embodiment of the present inventive concept, includes a cell array including a plurality of strings STR. The cell array includes bit lines BL1-BL3, word lines WL1-WL4, upper selection lines USL1-USL3, a lower selection line LSL and a common source line CSL. The cell array includes the plurality of strings STR between the bit lines BL1-BL3 and the common source line CSL.

Each string STR includes an upper selection transistor UST, a lower selection transistor LST and a plurality of memory cell transistors MC serially connected between the upper and lower selection transistors UST and LST. Drains of the upper selection transistors UST are connected to the bit lines BL1-BL3 and sources of the lower selection transistors LST are connected to the common source line CSL. The common source line CSL is a line to which the lower selection transistors LST are commonly connected.

Also, the upper selection transistors UST are connected to the upper selection lines USL1-USL3 and the lower selection transistors LST are connected to the lower selection line LSL. The memory cell transistors MC are connected to the word lines WL1-WL4.

The cell array is arranged in three dimensions and the strings STR have a structure in which memory cell transistors MC are serially connected to one another in a Z-axis direction perpendicular to an X-Y plane and parallel to an upper surface of a substrate. Thus, channels of the upper and lower selection transistors UST and LST and the memory cell transistors MC may be vertically provided in the X-Y plane.

In a nonvolatile memory device having a three dimensional structure, m number of memory cells may be provided to each X-Y plane, and the X-Y plane having the m number of the memory cells may be stacked n number of times in the Z-axis direction. Here, m and n are natural number.

Figure 2A:
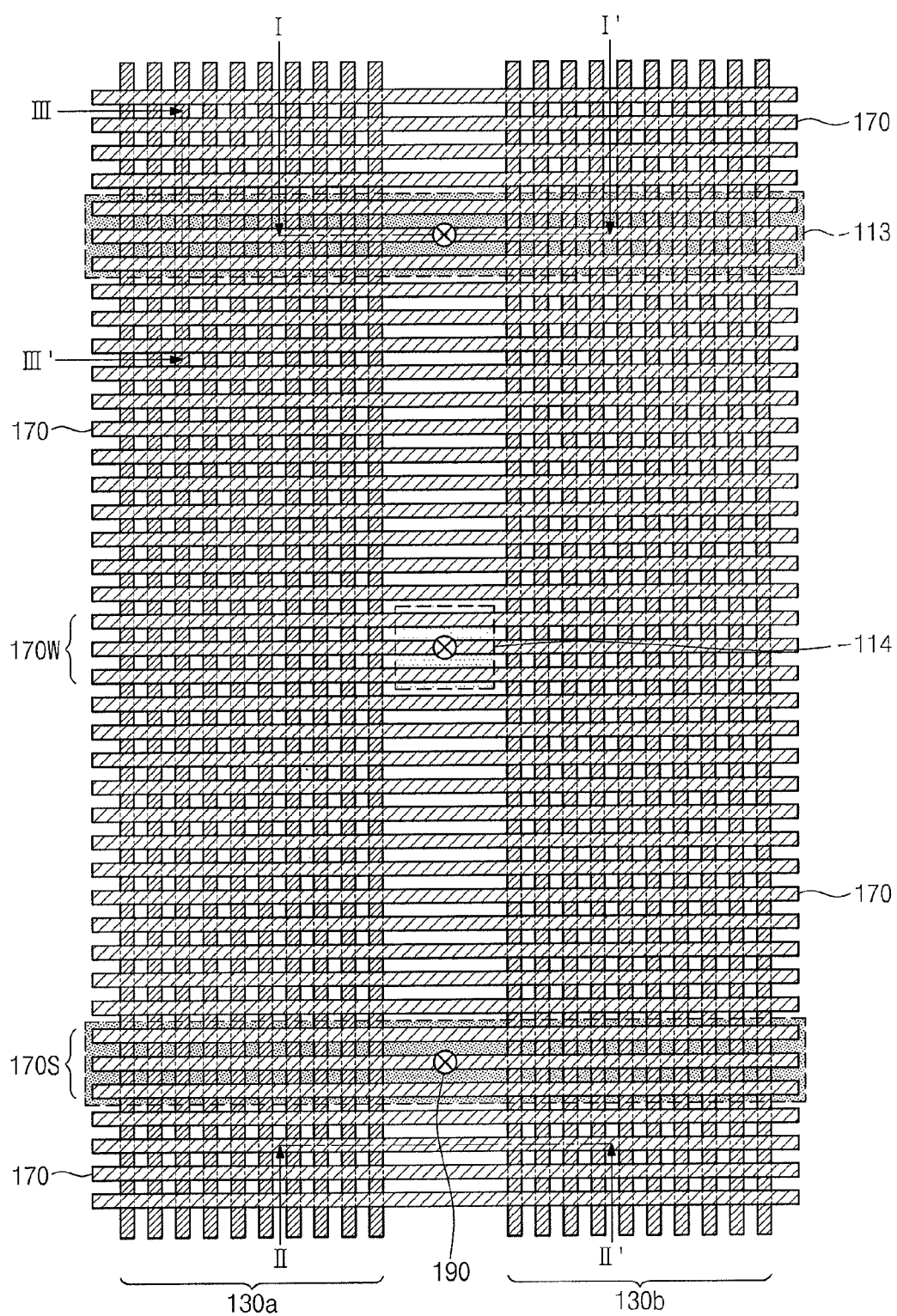
FIGS. 2A and 2E are top plan views illustrating nonvolatile memory devices, in accordance with an exemplary embodiment of the present inventive concept.
Figure 2B:
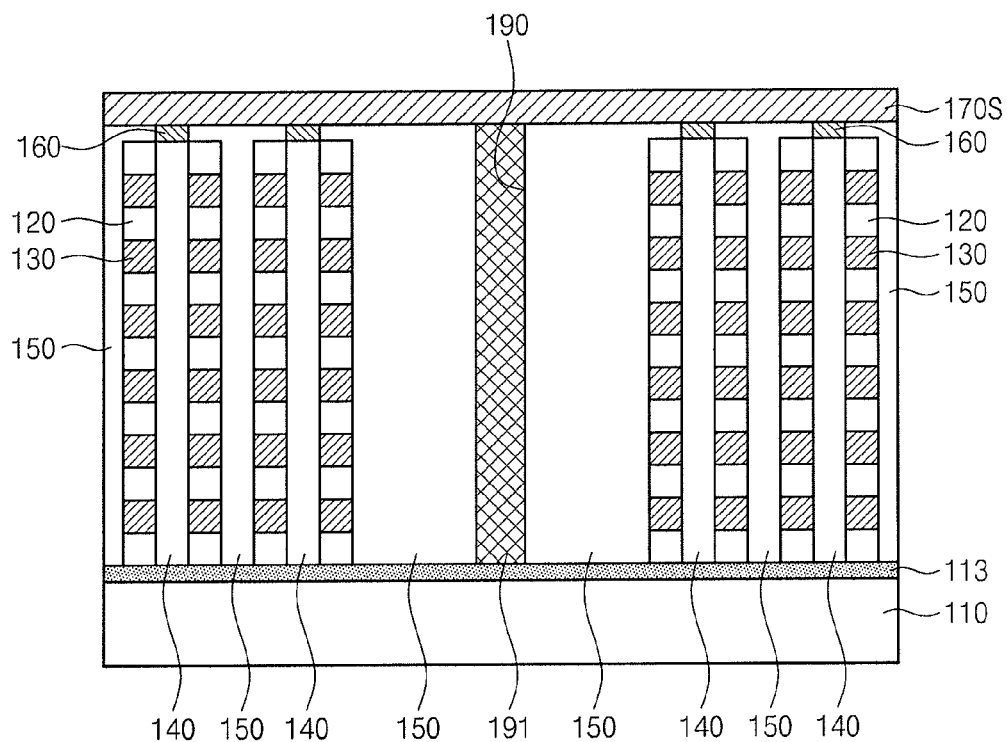
FIGS. 2B, 2C and 2D are cross-sectional views taken along the lines I-I', II-II' and III-III' of FIG. 2A, respectively.
Figure 2C:
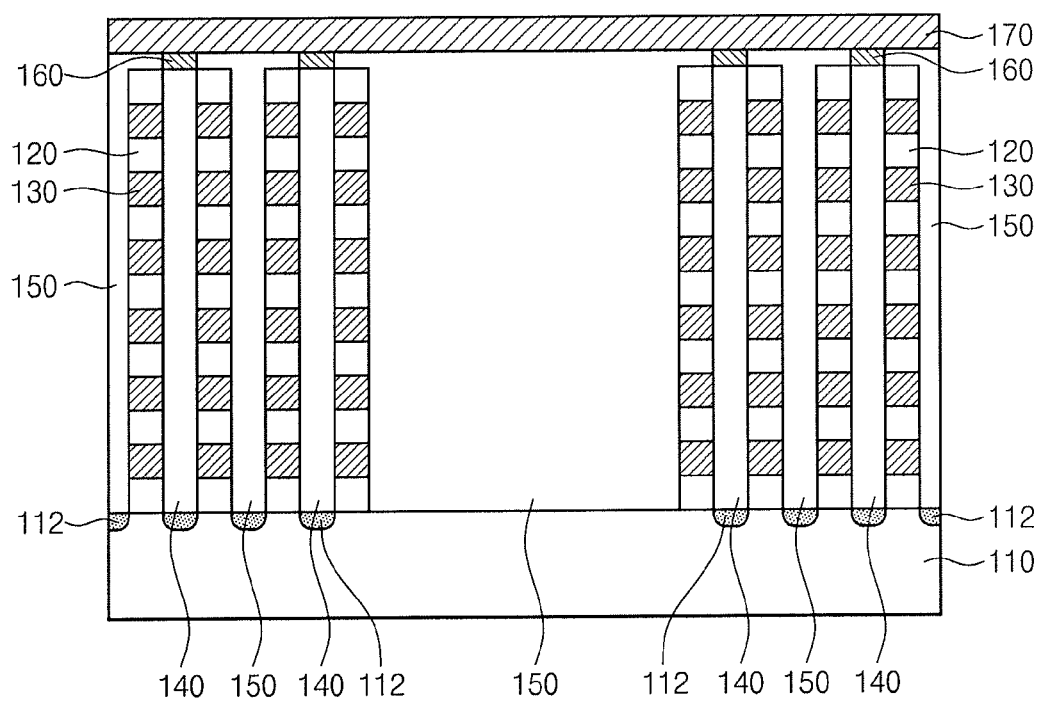
Figure 2D:
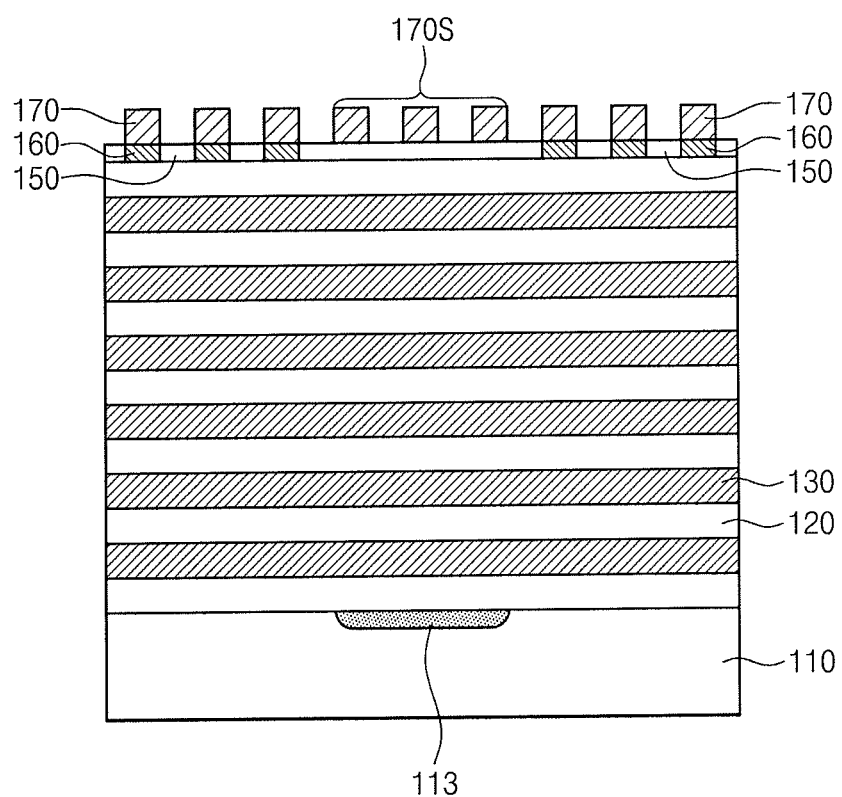
Figure 2E:
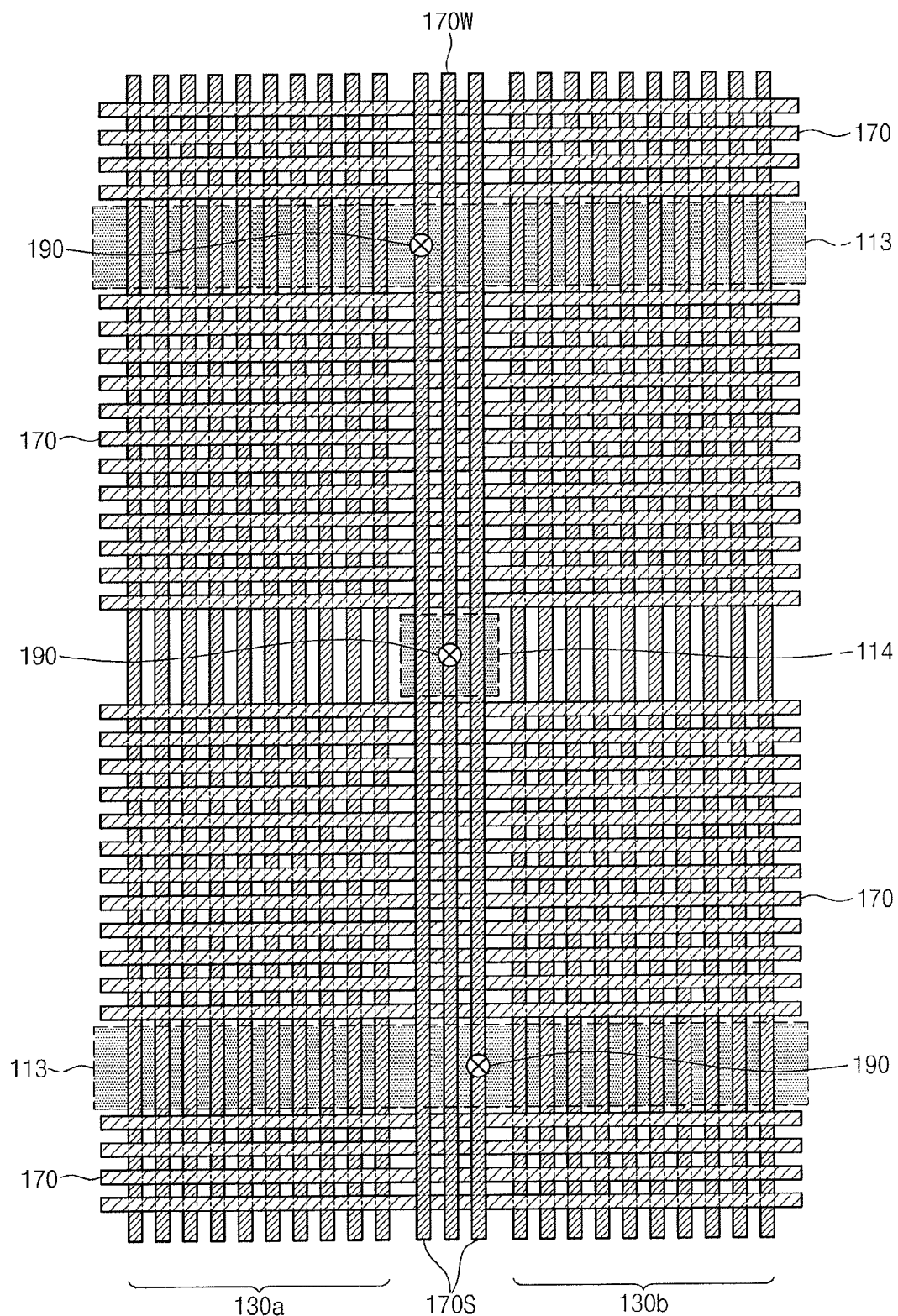

FIGS. 2A and 2E are top plan views illustrating nonvolatile memory devices, in accordance with an exemplary embodiment of the present inventive concept. FIGS. 2B, 2C and 2D are cross-sectional views taken along the lines I-I', II-II' and III-III' of FIG. 2A, respectively.

Referring to FIGS. 2A through 2E, a first cell array 130a and a second cell array 130b that are separated from each other may be disposed on a semiconductor substrate 110. The first and second cell arrays 130a and 130b may be structures in which an insulating layer and a conductive layer are alternately disposed on the semiconductor substrate 110.

More specifically, the insulating layer includes insulating layer patterns 120 of a line shape and the conductive layer includes gate electrodes 130, for example word lines, of a line shape. The insulating layer patterns 120 and the gate electrodes 130 are alternately stacked on the semiconductor substrate 110 to form a stacked structure of a line shape. The insulating layer patterns 120 and the gate electrodes 130 may be disposed to be separated from each other on the same layer. That is, the gate electrodes 130 may be three dimensionally arranged on the semiconductor substrate 110. The gate electrodes 130 three dimensionally arranged on the semiconductor substrate 110 may be, for example, a poly crystal semiconductor layer formed through an epitaxial growth process. Alternatively, the gate electrodes 130 may be, for example, a metal layer formed through a plating process.

First sidewalls of stacked structures in which the insulating layer patterns 120 and the gate electrodes 130 are alternately stacked may be symmetrically disposed to be separated from each other. That is, the first sidewalls of the adjacent stacked structures may be disposed to face each other.

Semiconductor patterns 140 which are provided to be a channel are disposed between the first sidewalls of the stacked structures in which the insulating layer patterns 120 and the gate electrodes 130 are alternately stacked. The semiconductor patterns 140 extend in a direction perpendicular to the semiconductor substrate 110 and a plurality of the gate electrodes 130 cross a sidewall of each of the semiconductor patterns 140. The semiconductor patterns 140 extending in the direction perpendicular to the semiconductor substrate 110 are electrically connected to bit lines 170 crossing the gate electrodes 130. The bit lines 170 may be directly in contact with upper surfaces of the semiconductor patterns 140 or may be electrically connected to the semiconductor patterns 140 through bit line contacts 160.

The first and second cell arrays 130a and 130b which are outside of the illustrated region may have a structure in which the insulating layer patterns 120 and the gate electrodes 130 are stacked in a stair shape in an extending direction of the first and second cell arrays 130a and 130b. The structure of the stair shape may be for obtaining a space for electrically connecting a word line selection line to each of the gate electrodes 130.

An insulating layer 150 may be provided between second sidewalls of the stacked structures in which the insulating layer patterns 120 and the gate electrodes 130 are alternately stacked. Also, the insulating layer 150 may be provided between the first and second cell arrays 130a and 130b which are separated from each other. Although not illustrated in the drawings, if the semiconductor patterns 140 are thinly provided between the first sidewalls of the stacked structures such that two semiconductor patterns are provided to be channels, an insulating layer may be provided between the two semiconductor patterns. A charge storage layer (not illustrated) may be disposed between the semiconductor patterns 140 and first sidewalls of the gate electrodes 130. The charge storage layer may include a charge tunneling layer, a charge trapping layer and a charge blocking layer. The charge tunneling layer may be in contact with the semiconductor patterns 140 for a channel and the charge blocking layer may be in contact with the gate electrodes 130.

Common source regions 112 may be provided in the semiconductor substrate 110 under the semiconductor patterns 140 in a direction in which the gate electrodes 130 extend. That is, the common source regions 112 may be provided between the gate electrodes 130 which are separated from each other in a direction horizontal to the semiconductor substrate 110. Thus, the common source regions 112 may not be provided to the whole semiconductor substrate 110, but may be provided to a portion of the semiconductor substrate 110.

Common source line strapping regions 113 which extend in a direction crossing the gate electrodes 130 to electrically connect the common source regions 112 to one another may be provided in the semiconductor substrate 110. A conductivity type of the common source line strapping regions 113 may be identical to the common source regions 112. Accordingly, the common source regions 112 are electrically connected to one another by the common source line strapping regions 113 and thereby the common source regions 112 may be concurrently operated by a voltage applied to the common source line strapping regions 113.

A well region 114 may be provided in a portion of the semiconductor substrate 110 which is separated from the common source regions 112 and disposed between the first and second cell arrays 130a and 130b which are separated from each other. The well region 114 may have a different conductivity type from the common source line strapping regions 113.

Contact holes 190 exposing a portion of each of the common source line strapping regions 113 and a portion of the well region 114 are provided to the semiconductor substrate 110 between the first and second cell arrays 130a and 130b which are separated from each other. A separated distance between the first and second cell arrays 130a and 130b may be greater than a separated distance between the stacked structures of a line shape. Thus, a process margin for forming the contact holes 190 may be sufficiently obtained.

Contact plugs 191 filling the contact holes 190 are provided. Common source lines 170S and a well line 170W electrically connected to the contact plugs 191 and running in a major axis direction which is an extending direction of the common source line strapping region 113 may be provided on the contact plugs 191. The common source lines 170S and the well line 170W may be provided to be parallel to the bit lines 170. Thus, the bit lines 170, the common source lines 170S and the well line 170W may be formed by one process. Alternatively, the common source lines 170S and the well line 170W may be provided on the contact plugs 191 while they are electrically connected to the contact plugs 191 in parallel to an extending direction of the gate electrodes 130 (see FIG. 2E). In this alternative embodiment, the common source lines 170S and the well line 170W running in the major axis direction which is the extending direction of the common source line strapping region 113 described above may not be provided or may be provided as dummy bit lines for convenience of a manufacturing process.

Figure 3A:
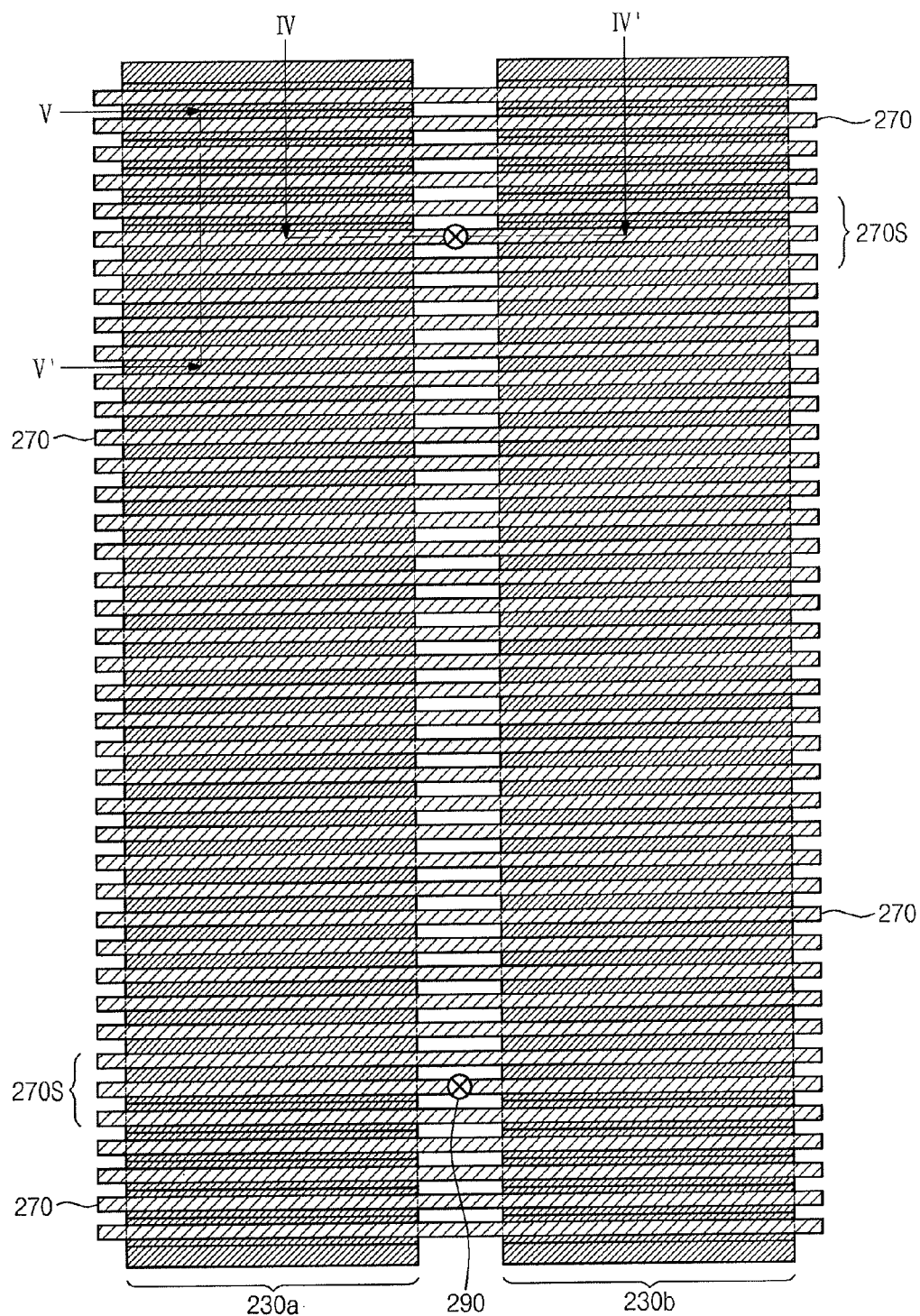
FIGS. 3A and 3D are top plan views illustrating nonvolatile memory devices, in accordance with another exemplary embodiment of the present inventive concept.
Figure 3B:
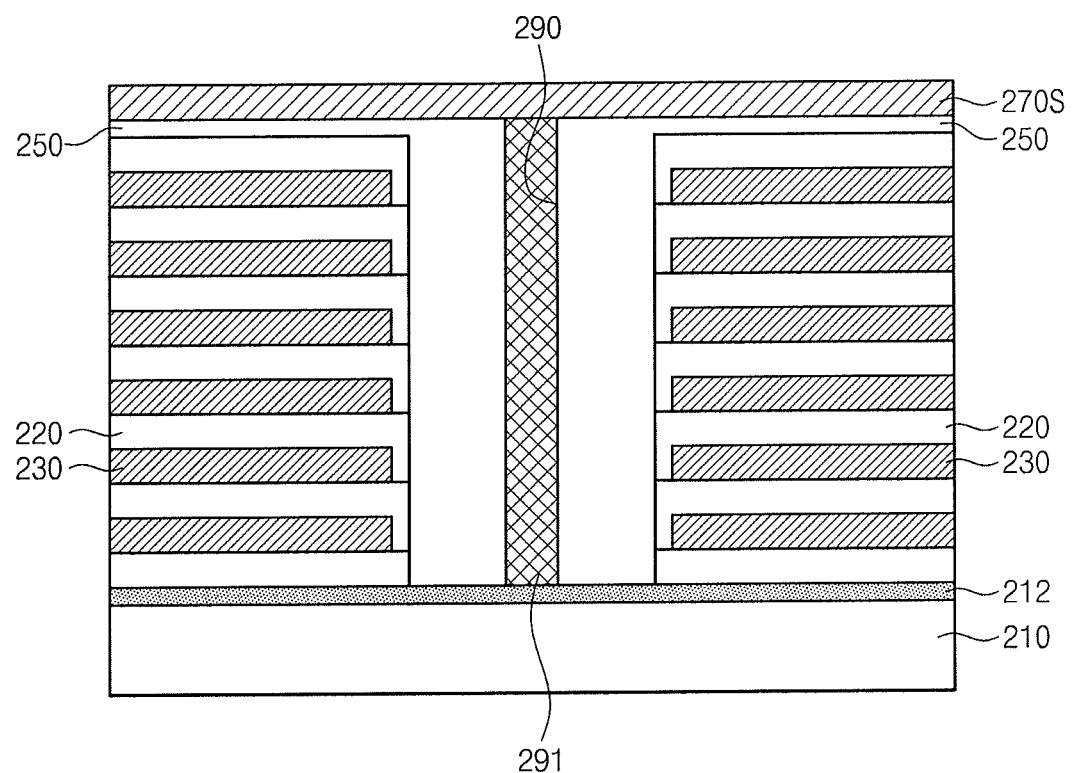
FIGS. 3B and 3C are cross-sectional views taken along the lines IV-IV' and V-V' of FIG. 3A, respectively.
Figure 3C:
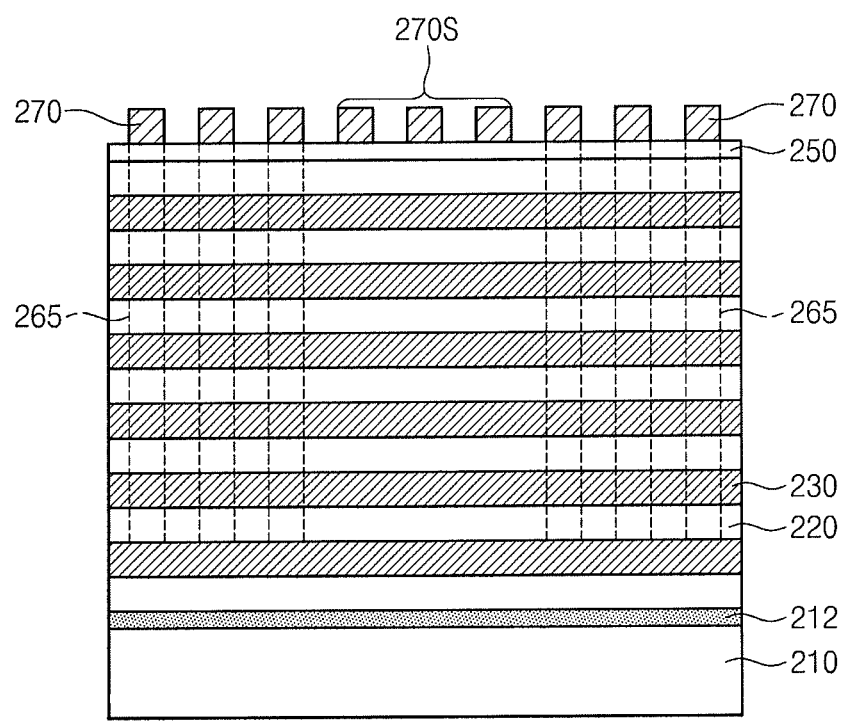
Figure 3D:
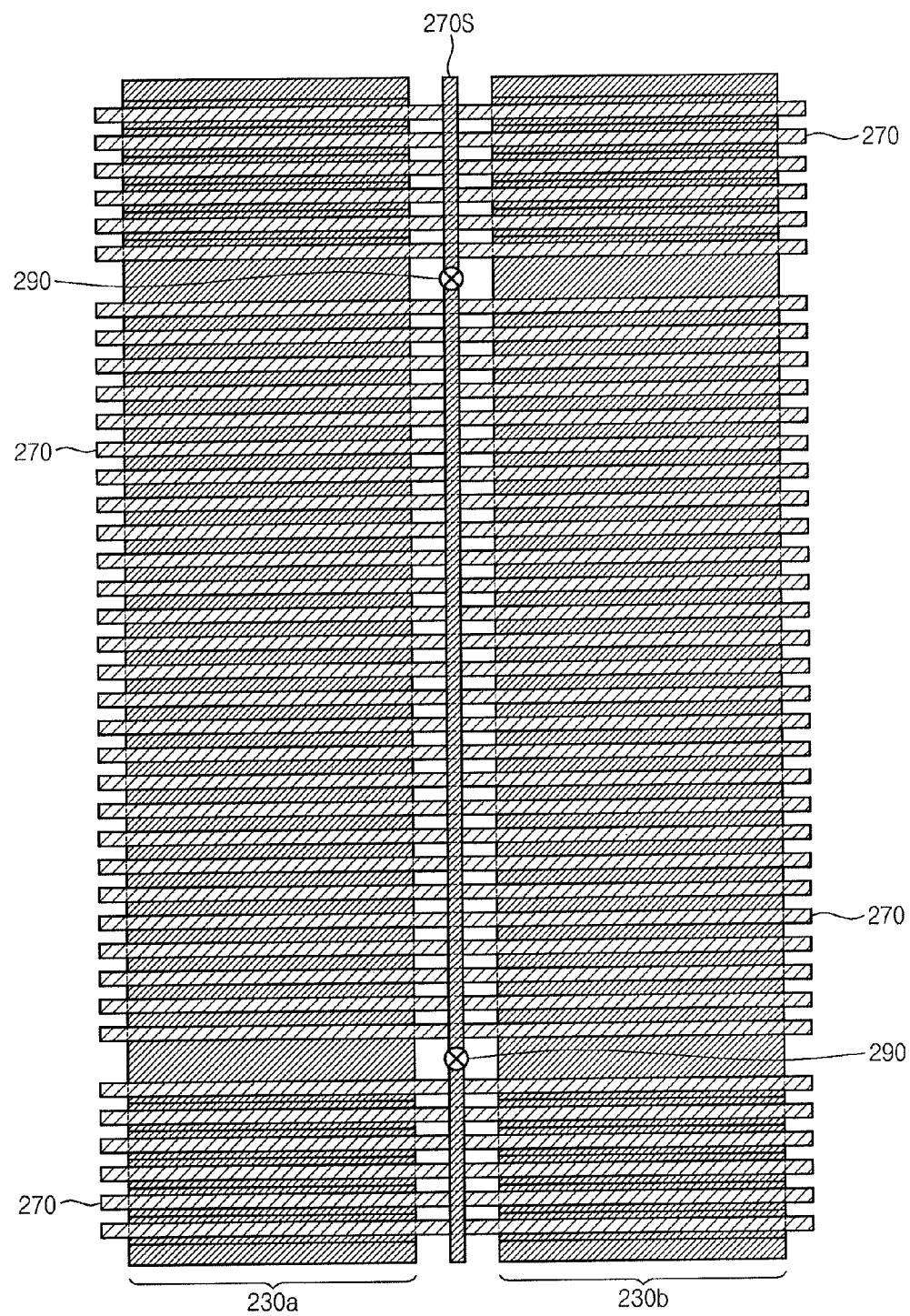

FIGS. 3A and 3D are top plan views illustrating nonvolatile memory devices, in accordance with another exemplary embodiment of the present inventive concept. FIGS. 3B and 3C are cross-sectional views taken along the lines IV-IV' and V-V' of FIG. 3A, respectively.

Referring to FIGS. 3A through 3D, a first cell array 230a and a second cell array 230b which are separated from each other may be disposed on a semiconductor substrate 210. The first cell array 230a and the second cell array 230b may be structures in which an insulating layer and a conductive layer are alternately stacked on the semiconductor substrate 210.

More specifically, the insulating layer includes insulating layer patterns 220 and the conductive layer includes word lines 230 of a plate shape. The insulating layer patterns 220 and the word lines 230 are alternately stacked on the semiconductor substrate 110 to form a stacked structure of a plate shape. That is, the word lines 230 may be three dimensionally arranged on the semiconductor substrate 210. The word lines 230 three dimensionally arranged on the semiconductor substrate 210 may be, for example, a poly crystal semiconductor layer formed through an epitaxial growth process. Alternatively, the word lines 230 may be, for example, a metal layer formed through a plating process.

The first and second cell arrays 230a and 230b which are outside of the illustrated region may have a structure in which the insulating layer patterns 220 and the word lines 230 are stacked in a stair shape in an extending direction of the first and second cell arrays 230a and 230b. The structure of the stair shape may be for obtaining a space for electrically connecting a word line selection line to each of the word lines 230. Accordingly, each area of the word lines 230 may become narrow as the word lines 230 extend in a stacked direction from the semiconductor substrate 210.

Semiconductor patterns 265 provided for a channel vertically extending from the semiconductor substrate 210 to penetrate the word lines 230 may be provided to a position at which the word lines 230 are superposed in the stacked direction. The semiconductor patterns 265 are electrically connected to bit lines 270 crossing the word lines 230. The bit lines 270 may be directly in contact with upper surfaces of the semiconductor patterns 265 or may be electrically connected to the semiconductor patterns 265 through bit line contacts.

An insulating layer 250 may be provided between the first and second cell arrays 230a and 230b which are separated from each other. Although not illustrated in the drawings, if the semiconductor patterns 265 are thinly provided to inner sides of the penetrated word lines 230 to have a cylinder shape, an insulating layer may also be provided to the inside of the semiconductor patterns 265. A charge storage layer (not illustrated) may be disposed between the semiconductor patterns 265 and the word lines 230. The charge storage layer may include a charge tunneling layer, a charge trapping layer and a charge blocking layer. The charge tunneling layer is in contact with the semiconductor patterns 265 and the charge blocking layer is in contact with the word lines 230.

A common source region 212 may be provided on an entire surface of the semiconductor substrate 210. Contact holes 290 exposing a portion of the common source region 212 provided on the semiconductor substrate 210 between the first and second cell arrays 230a and 230b which are separated from each other are provided.

Contact plugs 291 filling the contact holes 290 are provided. Common source lines 270S electrically connected to the contact plugs 291 and running in a direction crossing the first and second cell arrays 230a and 230b may be provided on the contact plugs 291. The common source lines 270S may be provided to be parallel to the bit lines 270. Thus, the bit lines 270 and the common source lines 270S may be formed by one process. Alternatively, the common source line 270S may be provided on the contact plugs 291 while it is electrically connected to the contact plugs 291 in parallel to an extending direction of the word lines 230 (see FIG. 3D). In this alternative embodiment, the common source lines 270S running in a direction crossing the first and second cell arrays 230a and 230b described above may not be provided or may be provided as dummy bit lines for convenience of a manufacturing process.

Word lines of a nonvolatile memory device having a three dimensional structure may be formed without disconnection by using a space between cell arrays separated from each other for strapping of a common source region and/or a well region in accordance with embodiments of the present inventive concept. Accordingly, a more simple process and a smaller space may be needed in accordance with the present inventive concept compared with a process and a space for strapping of a common source region and a well region having a conventional structure of three dimensions. Also, since a predetermined separated space between the cell arrays which are separated from each other is used as a strapping region, the same space may be needed in a nonvolatile memory device having a three dimensional structure stacked with more cells to increase density of a cell.

Figure 4:
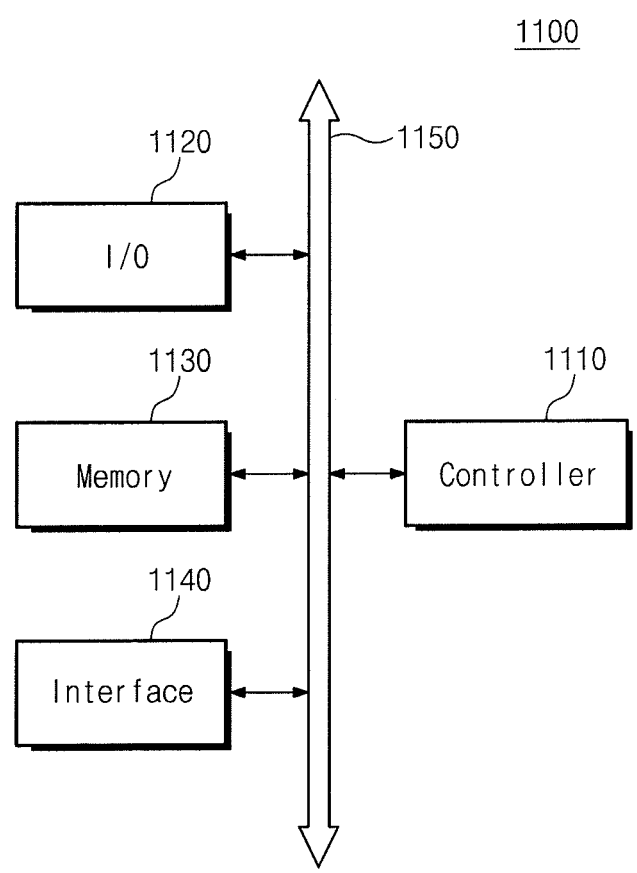
FIG. 4 is a block diagram illustrating an example of a memory system including a nonvolatile memory device, in accordance with exemplary embodiments of the present inventive concept.

FIG. 4 is a block diagram illustrating an example of a memory system including a nonvolatile memory device, in accordance with exemplary embodiments of the present inventive concept.

Referring to FIG. 4, a memory system 1100 may be applied to, for example, a personal digital assistant (PDA), a portable computer, a web tablet, a wireless phone, a mobile phone, a digital music player, a memory card or all devices which can transmit and/or receive data in a wireless environment.

The memory system 1100 includes a controller 1110, an input/output device 1120 such as a key pad, a key board and a display, a memory 1130, an interface 1140 and a bus 1150. The memory 1130 and the interface 1140 communicate with each other through the bus 1150.

The controller 1110 includes a microprocessor, a digital signal processor, a microcontroller or other process devices similar to the microprocessor, the digital signal processor and the microcontroller. The memory 1130 may be used to store commands executed by the controller 1110. The input/output device 1120 can receive data from the outside of the memory system 1100 or transmit data to the outside of the memory system 1100. For example, the input/output device 1120 may include a key board, a key pad or a display.

The memory 1130 includes a nonvolatile memory device, in accordance with exemplary embodiments of the present inventive concept, as described in connection with FIGS. 2A-2D and FIGS. 3A-3C. The memory 1130 may further include a different kind of a memory, for example, a volatile memory which can randomly access data and various other kinds of memories.

The interface 1140 transmits data to a communication network or receives data from a communication network.

Figure 5:
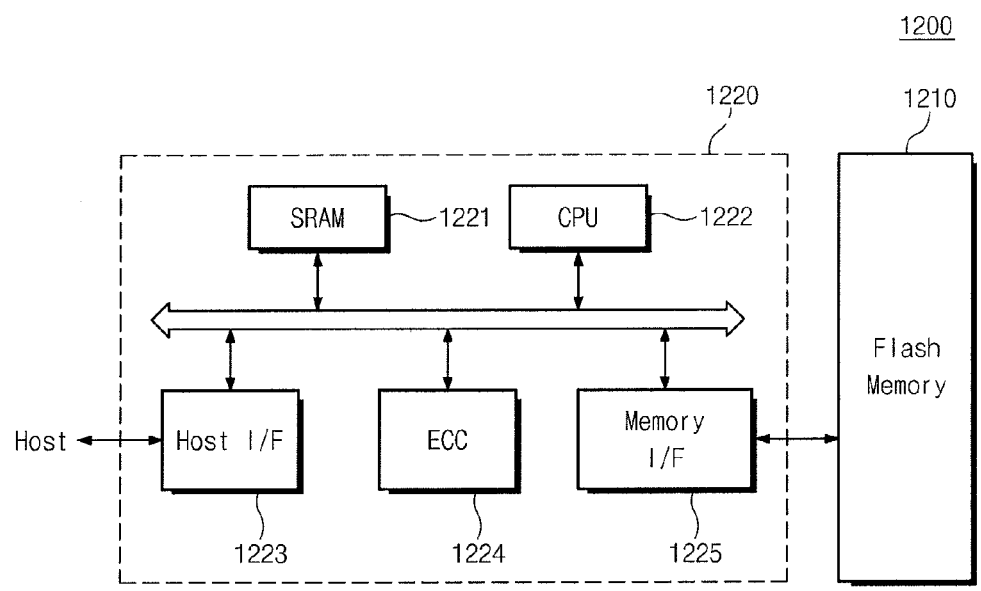
FIG. 5 is a block diagram illustrating an example of a memory card including a nonvolatile memory device, in accordance with exemplary embodiments of the present inventive concept.

FIG. 5 is a block diagram illustrating an example of a memory card including a nonvolatile memory device, in accordance with exemplary embodiments of the present inventive concept.

Referring to FIG. 5, a memory card 1200 for supporting a storage capability of large amounts of data is fitted with a flash memory device 1210, in accordance with the present inventive concept. The flash memory device 1210 includes a nonvolatile memory device, in accordance with exemplary embodiments of the present inventive concept, as described in connection with FIGS. 2A-2D and FIGS. 3A-3C. The memory card 1200 includes a memory controller 1220 controlling all data exchanges between a host and the flash memory device 1210.

A static random access memory (SRAM) 1221 is used as an operation memory of a central processing unit (CPU) 1222. A host interface (I/F) 1223 includes a data exchange protocol of a host connected to the memory card 1200. An error correction code (ECC) block 1224 detects and corrects an error included in data read from the flash memory device 1210 having a multi-bit characteristic. A memory interface 1225 interfaces with the flash memory device 1210. The central processing unit (CPU) 1222 performs all control operations for data exchange of the memory controller 1220. Although not illustrated in the drawings, the memory card 1200 may further include a read only memory (ROM) for storing code data for interfacing with the host.

According to the flash memory device 1210, the memory card 1200 or the memory system of the present inventive concept, a memory system having high reliability may be provided through a flash memory device having an improved erase characteristic of dummy cells. In particular, a flash memory device of the present inventive concept may be provided to a memory system such as a solid state disc (SSD). In this case, a memory system having high reliability may be realized by cutting off a read error caused by a dummy cell.

Figure 6:
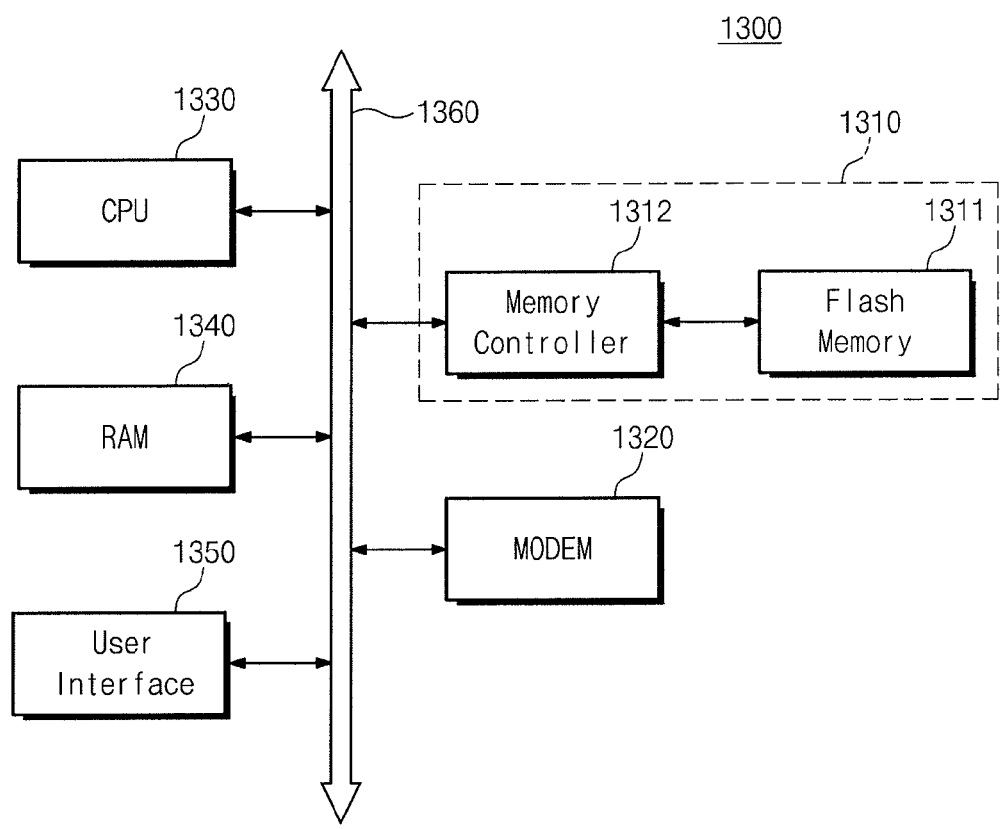
FIG. 6 is a block diagram illustrating an example of a data processing system including a nonvolatile memory device, in accordance with exemplary embodiments of the present inventive concept.

FIG. 6 is a block diagram illustrating an example of a data processing system including a nonvolatile memory device, in accordance with exemplary embodiments of the present inventive concept.

Referring to FIG. 6, a flash memory system 1310 of the present inventive concept is built in a data processing system 1300 such as a mobile device or a desktop computer. The data processing system 1300, in accordance with the present inventive concept, includes the flash memory system 1310, a modem 1320, a central processing unit 1330, a RAM 1340 and a user interface 1350 that are electrically connected to a system bus 1360. The flash memory system 1310 may be constituted in the same in the same manner as the memory system or the flash memory system described above in connection with FIGS. 4 and 5. The flash memory system 1310 stores data processed by the central processing unit 1330 or data received from the outside. In this case, the data processing system 1300 can stably store large amounts of data in the flash memory system 1310. As reliability increases, the flash memory system 1310 can reduce resources required in an error correction, thereby providing a data exchange function of high speed to the data processing system 1300. Although not illustrated in the drawings, the data processing system 1300 may further include an application chipset, an image signal processor (ISP), an input/output device or the like.

The flash memory device or the memory system in accordance with the inventive concept may be mounted by various types of packages such as package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), thin quad flat pack (TQFP), system in package (SIP), multi chip package (MCP), wafer-level fabricated package (WFP) and wafer-level processed stack package (WSP).

As described above, cell arrays are separated from each other so as to provide a space for strapping of the common source region and/or the well region and thereby word lines of a nonvolatile memory device having a three dimensional structure can be formed without disconnection. Thus, semiconductor devices including a nonvolatile memory device having a three dimensional structure having high integration without increasing a size of a cell array may be provided.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A nonvolatile memory device comprising:
    cell arrays having a plurality of insulating layer patterns and a plurality of conductive patterns that are alternately and repeatedly stacked on a semiconductor substrate, the cell arrays being separated from each other;
    semiconductor patterns extending from the semiconductor substrate to cross sidewalls of the conductive patterns;
    a first impurity region provided in the semiconductor substrate, wherein the first impurity region includes portions which are vertically overlapped with the cell arrays;
    a second impurity region provided in the semiconductor substrate, wherein the second impurity region has a different conductivity type from the first impurity region and includes at least a portion which is provided between the separated cell arrays; and
    a first contact plug provided on the substrate between the separated cell arrays and connected to the at least a portion of the second impurity region.

2. The nonvolatile memory device of claim 1, wherein the plurality of conductive patterns extend in a first direction, the cell arrays are spaced from each other in a second direction crossing the first direction, and
    the nonvolatile memory device further comprising:
    a conductive line provided in the first direction or in the second direction, the first conductive line being electrically connected to the first contact plug.

3. The nonvolatile memory device of claim 1, further comprising a second contact plug directly connected to the first impurity region.

4. The nonvolatile memory device of claim 3, wherein the plurality of conductive patterns extend in a first direction, the cell arrays are spaced from each other in a second direction crossing the first direction, and
    the nonvolatile memory device further comprising:
    a conductive line provided in the first direction or in the second direction, the conductive line being electrically connected to the second contact plug.

5. The nonvolatile memory device of claim 1, wherein the plurality of conductive patterns extend in a first direction, the cell arrays are spaced from each other in a second direction crossing the first direction, and
    the nonvolatile memory device further comprising:
    a first conductive line provided in the first direction, the first conductive line being electrically connected to the first contact plug.

6. The nonvolatile memory device of claim 5, the nonvolatile memory device further comprising:
    a second contact plug directly connected to the first impurity region; and
    a second conductive line provided in the first direction, the second conductive line being electrically connected to the second contact plug.

7. The nonvolatile memory device of claim 1, wherein the plurality of conductive patterns extend in a first direction, the cell arrays are spaced from each other in a second direction crossing the first direction, and
    the nonvolatile memory device further comprising:
    a first conductive line provided in the second direction, the first conductive line being electrically connected to the first contact plug.

8. The nonvolatile memory device of claim 7, the nonvolatile memory device further comprising:
    a second contact plug directly connected to the first impurity region; and
    a second conductive line provided in the second direction, the second conductive line being electrically connected to the second contact plug.

* * * * *